(12) United States Patent
Bleeker et al.

(10) Patent No.: US 7,440,078 B2
(45) Date of Patent: Oct. 21, 2008

(54) LITHOGRAPHIC APPARATUS AND DEVICE MANUFACTURING METHOD USING INTERFEROMETRIC AND MASKLESS EXPOSURE UNITS

(75) Inventors: Arno Jan Bleeker, Waalre (NL); Kars Zeger Troost, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 121 days.

(21) Appl. No.: 11/311,640

(22) Filed: Dec. 20, 2005

(65) Prior Publication Data

US 2007/0139633 A1 Jun. 21, 2007

(51) Int. Cl.
*G03B 27/42* (2006.01)
(52) U.S. Cl. ............................. 355/53; 355/67; 378/34; 378/35
(58) Field of Classification Search .................. 355/53, 355/67, 71
See application file for complete search history.

(56) References Cited

U.S. PATENT DOCUMENTS

| | | | |
|---|---|---|---|
| 4,560,249 A | 12/1985 | Nishiwaki et al. | |
| 4,596,467 A | 6/1986 | Bartelt | |
| 4,792,197 A | 12/1988 | Inoue et al. | |
| 4,806,454 A | 2/1989 | Yoshida et al. | |
| 5,142,385 A | 8/1992 | Anderson et al. | |
| 5,229,872 A | 7/1993 | Mumola | |
| 5,296,891 A | 3/1994 | Vogt et al. | |
| 5,414,835 A | 5/1995 | Iijima | |
| 5,415,835 A * | 5/1995 | Brueck et al. ............... | 430/311 |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,640,239 A | 6/1997 | Takamiya et al. | |
| 5,677,703 A | 10/1997 | Bhuva et al. | |
| 5,705,321 A | 1/1998 | Brueck et al. | |
| 5,759,744 A | 6/1998 | Brueck et al. | |
| 5,771,098 A | 6/1998 | Ghosh et al. | |
| 5,808,797 A | 9/1998 | Bloom et al. | |
| RE36,113 E | 2/1999 | Brueck et al. | |
| 5,982,553 A | 11/1999 | Bloom et al. | |
| 6,013,396 A | 1/2000 | Capodieci | |
| 6,133,986 A | 10/2000 | Johnson | |
| 6,177,980 B1 | 1/2001 | Johnson | |

(Continued)

FOREIGN PATENT DOCUMENTS

EP 0243520 B1 11/1991

(Continued)

OTHER PUBLICATIONS

Search Report, dated Jun. 28, 2007, for European Application No. 06256212.0-1226, 9 pgs.

(Continued)

*Primary Examiner*—Della J. Rutledge
(74) *Attorney, Agent, or Firm*—Sterne, Kessler, Goldstein & Fox P.L.L.C.

(57) ABSTRACT

A lithographic system combining an interference exposure unit and a lithography unit. The lithography unit can comprise an array of individually controllable elements. The lithography system can be arranged such that a pitch of the lines exposed by the interference exposure unit is an integer multiple of a size of an exposure area of the lithography unit corresponding to a single individually controllable element.

20 Claims, 10 Drawing Sheets

U.S. PATENT DOCUMENTS

| | | |
|---|---|---|
| 6,178,000 B1 | 1/2001 | Hoffnagle |
| 6,185,019 B1 | 2/2001 | Hobbs et al. |
| 6,233,044 B1 | 5/2001 | Brueck et al. |
| 6,304,318 B1 | 10/2001 | Matsumoto |
| 6,504,644 B1 * | 1/2003 | Sandstrom ............... 250/492.2 |
| 6,556,280 B1 | 4/2003 | Kelsey et al. |
| 6,687,041 B1 | 2/2004 | Sandstrom |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 6,816,233 B2 * | 11/2004 | Sugita .......................... 355/53 |
| 6,830,850 B1 | 12/2004 | Krivokapic et al. |
| 6,882,477 B1 | 4/2005 | Schattenburg et al. |
| 7,005,235 B2 * | 2/2006 | Lin ............................ 430/311 |
| 2001/0021487 A1 | 9/2001 | Williams et al. |
| 2001/0035991 A1 | 11/2001 | Hobbs et al. |
| 2002/0030802 A1 | 3/2002 | Sugita et al. |
| 2002/0031725 A1 | 3/2002 | Sugita et al. |
| 2002/0134985 A1 | 9/2002 | Chen et al. |
| 2002/0149751 A1 | 10/2002 | Bloomstein et al. |
| 2002/0149757 A1 | 10/2002 | Kelsey et al. |
| 2002/0149849 A1 | 10/2002 | Kelsey et al. |
| 2003/0098979 A1 | 5/2003 | Dress et al. |
| 2003/0147082 A1 | 8/2003 | Goldstein |
| 2004/0041104 A1 | 3/2004 | Liebregts et al. |
| 2004/0042724 A1 | 3/2004 | Gombert et al. |
| 2004/0110092 A1 | 6/2004 | Lin |
| 2004/0130561 A1 | 7/2004 | Jain |
| 2005/0007572 A1 | 1/2005 | George et al. |
| 2005/0012933 A1 | 1/2005 | Matthews |
| 2005/0057735 A1 | 3/2005 | Smith |
| 2005/0064297 A1 * | 3/2005 | Wago ............................ 430/5 |
| 2005/0073671 A1 | 4/2005 | Borodovsky |
| 2005/0074698 A1 | 4/2005 | Borodovsky |
| 2005/0088633 A1 | 4/2005 | Borodovsky |
| 2005/0094152 A1 | 5/2005 | Allen |
| 2005/0105100 A1 | 5/2005 | Swindal |
| 2005/0168717 A1 | 8/2005 | Hinsberg, III et al. |

FOREIGN PATENT DOCUMENTS

| | | |
|---|---|---|
| EP | 0915 384 A2 | 5/1999 |
| JP | 61-190368 A | 8/1986 |
| JP | 3-263313 A | 11/1991 |
| JP | 4-163461 A | 6/1992 |
| JP | 5-072408 A | 3/1993 |
| JP | 5-217856 A | 8/1993 |
| JP | 6-053122 A | 2/1994 |
| JP | 6-053122 U | 7/1994 |
| JP | 10-270330 A | 10/1998 |
| JP | 2000-021716 A | 1/2000 |
| JP | 2000-021720 A | 1/2000 |
| JP | 2000-223400 A | 8/2000 |
| JP | 2001-007020 A | 1/2001 |
| JP | 2001-223149 A | 8/2001 |
| JP | 2002-162750 A | 6/2002 |
| JP | 2004-014866 A | 1/2004 |
| JP | 2004-014867 A | 1/2004 |
| JP | 2004-317922 A | 11/2004 |
| JP | 2005-099537 A | 4/2005 |
| JP | 2005-134873 A | 5/2005 |
| KR | 9401227 B1 | 2/1994 |
| KR | 1999-0045024 A | 6/1999 |
| WO | WO 98/18049 A1 | 4/1998 |
| WO | WO 98/33096 A1 | 7/1998 |
| WO | WO 98/38597 A2 | 9/1998 |
| WO | WO 98/38597 A3 | 9/1998 |
| WO | WO 2004/003611 A1 | 1/2004 |
| WO | WO 2004/088363 A1 | 10/2004 |

OTHER PUBLICATIONS

Translation of Office Action for Korean Application No. 10-2006-0131207 drafted on Nov. 17, 2007, 4 pgs.

* cited by examiner

LITHOGRAPHIC APPARATUS AND DEVICE MANUFACTURING METHOD USING INTERFEROMETRIC AND MASKLESS EXPOSURE UNITS

BACKGROUND

1. Field of the Invention

The present invention relates to a lithographic system and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (resist) provided on the substrate.

Instead of a circuit pattern, the patterning device can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

In order to generate devices with ever smaller features, with ever more customization within devices and in ever more cost-effective ways, there is a continuing drive to improve lithographic methods. However, these three goals often interfere. For example, a new technique can permit the provision of smaller features, but increases the processing time necessary to form the device, thereby increasing the cost of the device. Similarly, provision of processes that allow greater flexibility in forming the devices can require a compromise in the size of the features that can be formed and/or increase the cost of forming the device.

What is needed is a lithographic system and method that provide a suitable compromise between the desire to form smaller features, the desire to provide a flexible lithographic system, and the desire to form devices for minimum costs.

SUMMARY

In one embodiment of the present invention, there is provided a lithographic system for exposing a pattern on a substrate comprising a first exposure unit and a second exposure unit. The first exposure unit projects two beams of radiation onto at least a portion of the substrate, such that the two beams of radiation interfere to expose a plurality of lines. The second exposure unit modulates a beam of radiation using an array of individually controllable elements and projects the modulated beam of radiation onto at least a portion of the substrate. The first and second exposure units are configured so a pitch of the lines exposed by the first exposure unit is an integer multiple of a width of a single individually controllable element.

In another embodiment of the present invention, there is provided a device manufacturing method comprising the following steps. Effecting a first type of exposure on a substrate by projecting two beams of radiation onto at least a portion of the substrate, such that the two beams of radiation interfere to expose a plurality of lines. Effecting a second type of exposure on the substrate by modulating a beam of radiation using an array of individually controllable elements and projecting the modulated beam of radiation onto at least a portion of the substrate. The first and second exposure units are configured so a pitch of the lines exposed by the first exposure unit is an integer multiple of a width of a single individually controllable element.

In a further embodiment of the present invention, there is provided a lithographic system for exposing a pattern on a substrate comprising a radiation sensitive layer processing unit, a lithography unit, and an interference exposure unit. The radiation sensitive layer processing unit is configured to perform at least one of: applying a layer of radiation sensitive material to a substrate before an exposure, heating the unexposed substrate, applying an anti-reflective coating to the substrate, heating the substrate after exposure, controlled cooling of the substrate after heating and removal of one of exposed and unexposed resist from the substrate. The lithography unit modulates a beam of radiation and projects the modulated radiation beam onto a substrate. The interference exposure unit projects two beams of radiation onto at least a portion of a substrate, such that the two beams of radiation interfere to expose a plurality of lines on the substrate. The interference exposure unit is arranged such that a substrate can be transferred from the radiation sensitive layer processing unit to the lithography unit through the interference exposure unit.

In a yet further embodiment of the present invention, there is provided an interference exposure unit. The interference exposure unit projects two beams of radiation onto at least a portion of a substrate, such that the two beams of radiation interfere to expose a plurality of lines on the substrate. The interference exposure unit transfers a substrate between a radiation sensitive layer processing unit and a lithography unit. The radiation sensitive layer processing unit performs at least one of: applying a layer of radiation sensitive material to a substrate before an exposure, heating the unexposed substrate, applying an anti-reflective coating to the substrate, heating the substrate after exposure, controlled cooling of the substrate after heating and removal of one of exposed and unexposed resist from the substrate. The lithography unit modulates a beam of radiation and projects the modulated beam of radiation onto a substrate.

In yet another embodiment of the present invention, there is provided a device manufacturing method comprising the following steps. Processing a substrate in a radiation sensitive layer processing unit configured to perform at least one of: applying a layer of radiation sensitive material to a substrate before an exposure, heating the unexposed substrate, applying an anti-reflective coating to the substrate, heating the substrate after exposure, controlled cooling of the substrate after heating and removal of one of exposed and unexposed resist from the substrate. Projecting a modulated beam of radiation onto the substrate in a lithography unit. Between at least one processing step performed in the radiation sensitive layer processing unit and at least one radiation beam projection step performed in the lithography unit, the substrate is transferred through an interference exposure unit, in which the beams of radiation are projected onto at least a portion of the substrate such that the two beams of radiation interfere to expose a plurality of lines on the substrate.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
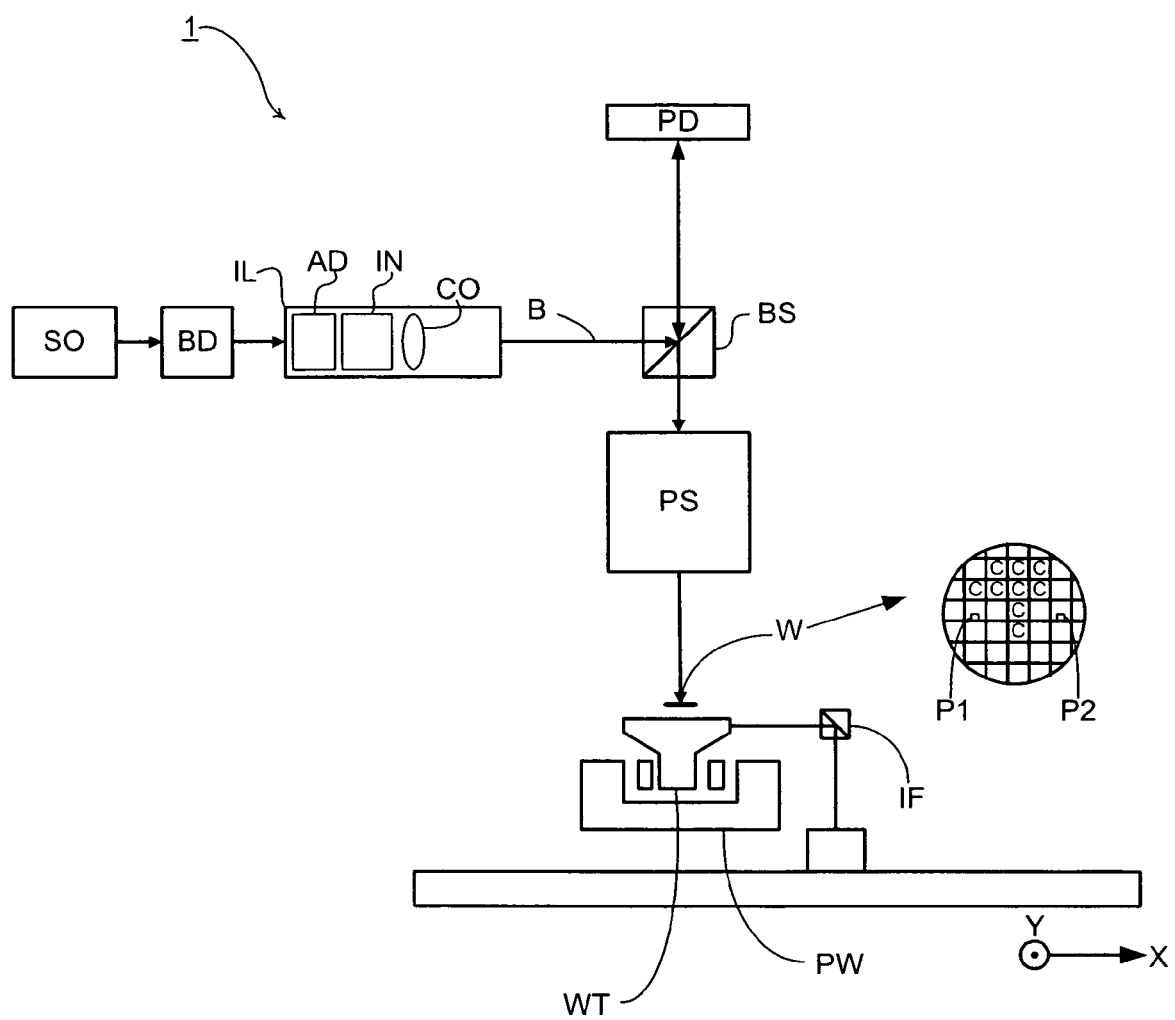
FIGS. 1 and 2 depict lithographic apparatus, according to various embodiments of the present invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

FIG. 1 schematically depicts the lithographic apparatus of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

In example where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 µm, e.g., at least 10 µm, at least 200 µm, at least 300 µm, at least 400 µm, at least 500 µm, or at least 600 µm. In one example, the thickness of the substrate is at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

Figure 2:
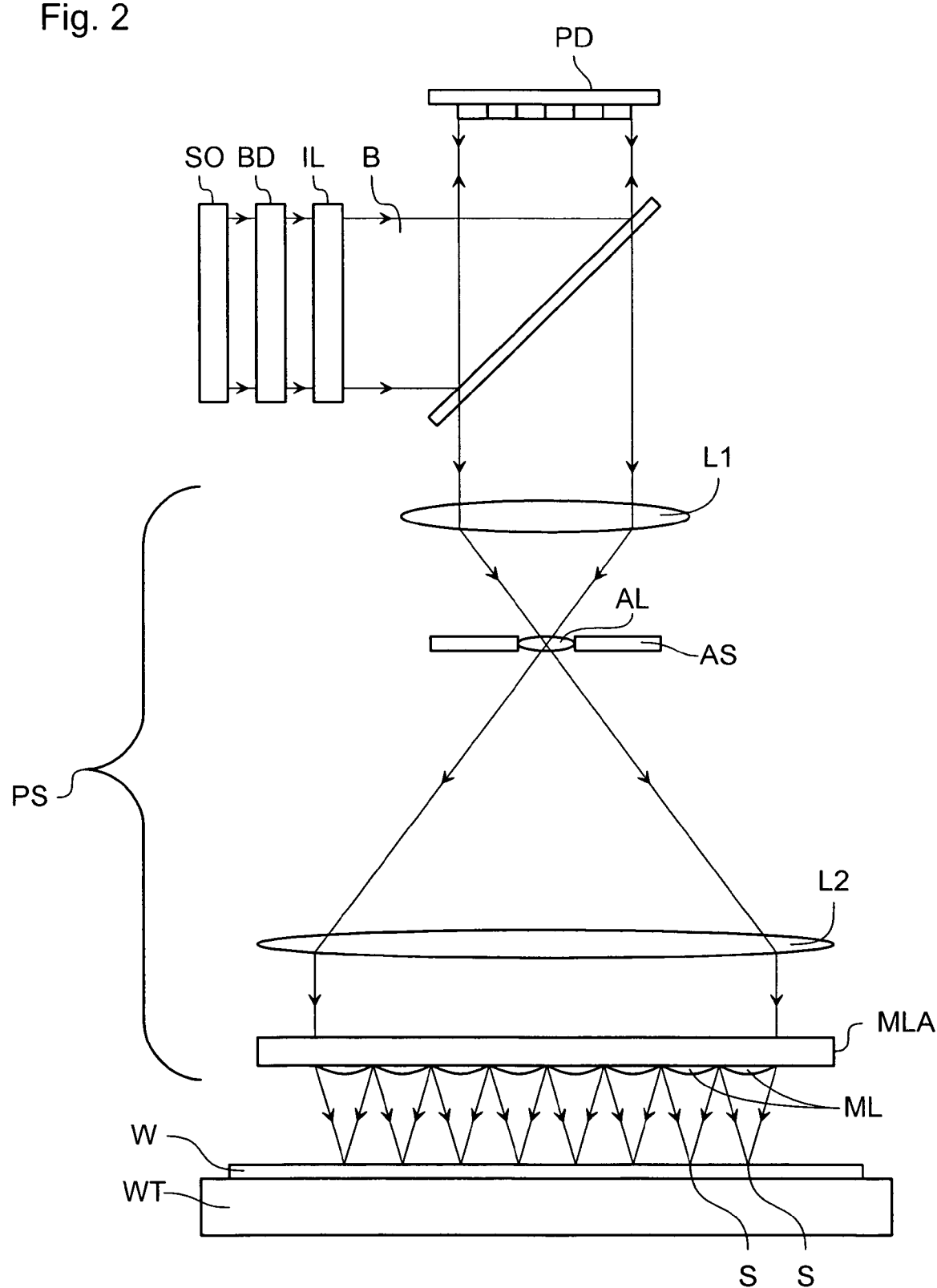

As herein depicted in FIGS. 1 and 2, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In one example, the apparatus is absent at least a short stroke module for moving substrate table WT. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS.

In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). In an embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In an embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (e.g., a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

FIG. 2 depicts an arrangement of a lithographic apparatus, according to one embodiment of the present invention. This embodiment can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
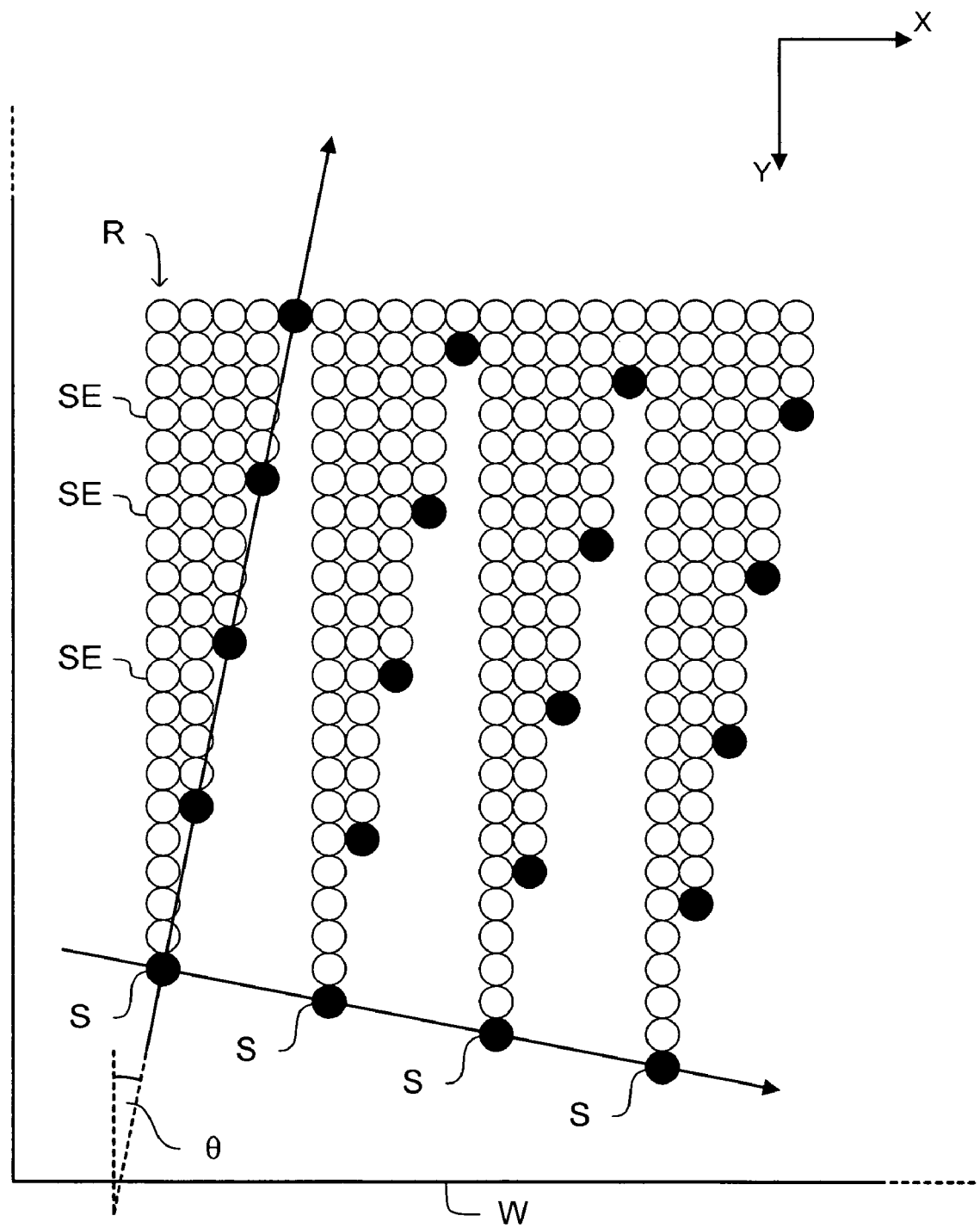
FIG. 3 depicts a mode of transferring a pattern to a substrate according to an embodiment of the invention as show in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle θ is at most 20°, 10°, e.g., at most 5°, at most 3°, at most 1°, at most 0.5°, at most 0.25°, at most 0.10°, at most 0.05°, or at most 0.01°. In one example, the angle θ is at least 0.001°.

Figure 4:
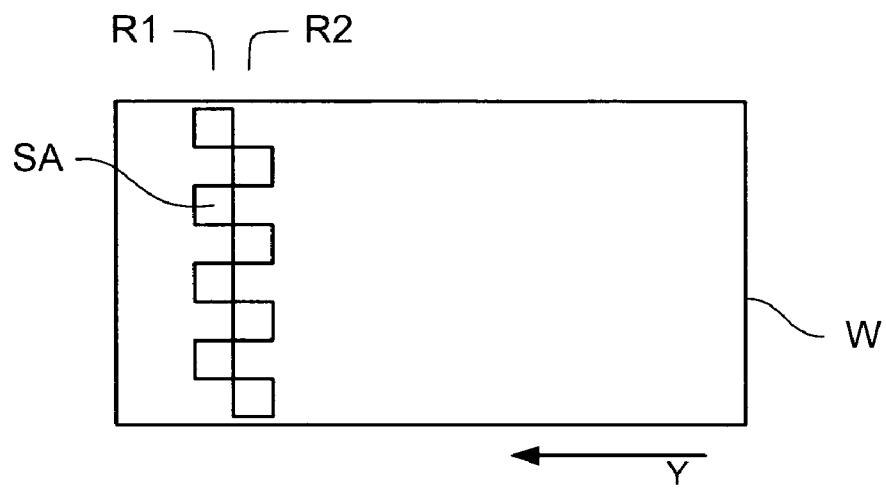
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots S slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

In one embodiment, The lithographic system of the present invention contains two exposure units. The first exposure unit is an interference exposure unit. In such exposure units, beams of radiation are projected onto a substrate such that they interfere. The interference pattern forms an exposure on the substrate. For example, two beams of radiation can be projected onto the substrate which interfere to expose a plurality of lines on the substrate, corresponding to lines of maxima caused by constrictive interference between the beams of radiation, separated by minima caused by destructive interference between the two beams of radiation.

The second exposure unit can correspond to a lithographic apparatus, for example as previously described. In particular, the lithographic apparatus can utilize an array of individually controllable elements to modulate a beam of radiation that is projected onto the substrate.

It will be appreciated that both exposure units can be configured to expose only a portion of the substrate at any particular instant. The portion of the substrate that is exposed at any given instant can correspond to the portion of a substrate used to form a single device or a portion thereof. It will be appreciated, however, that one or both of the exposure units can, alternatively, expose the entire substrate with a single exposure.

Figure 5:
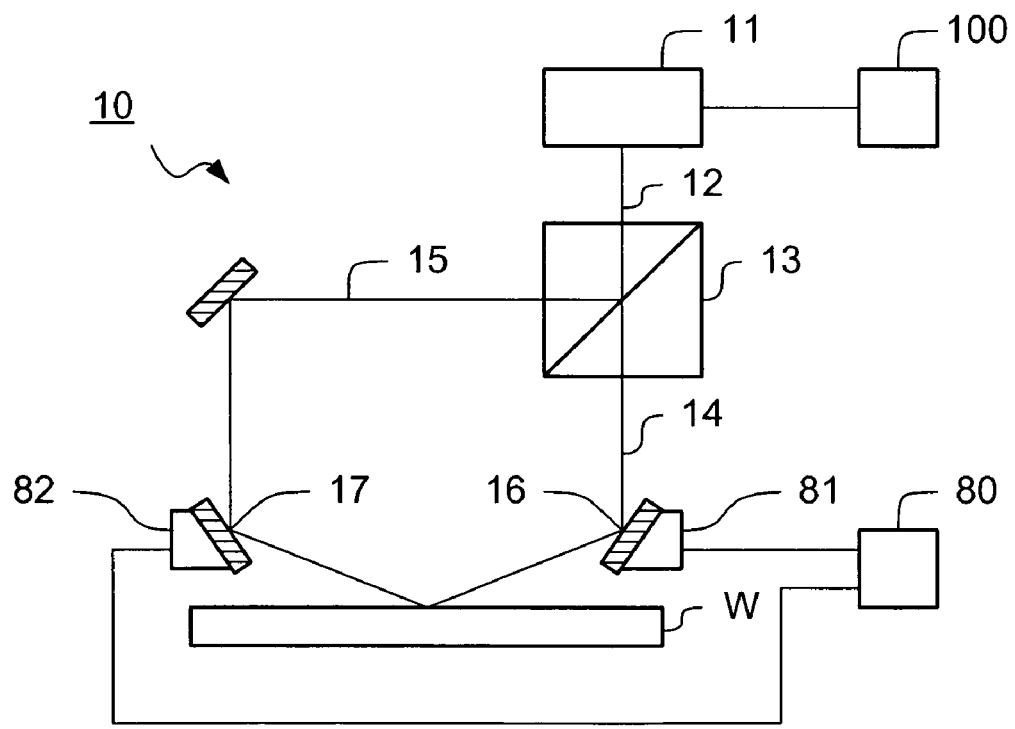
FIG. 5 depicts an exposure unit that can be used in a lithographic system, according to one embodiment of the present invention.

FIG. 5 depicts in more detail a possible arrangement of a first exposure unit 10, according to one embodiment of the present invention. In the example shown, the first exposure unit 10 has a radiation source 11 providing a beam of radiation 12. The beam of radiation 12 is split by a radiation beam splitter 13 to form first and second beams of radiation 14,15. The first and second beams of radiation 14,15 are directed on to the substrate W by way of respective reflectors 16,17 at oblique angles to the substrate. The first and second beams of radiation 14,15 are directed onto the substrate such that the beams of radiation interfere at the substrate, creating maxima and minima, as discussed above, resulting in the exposure of a plurality of lines on the substrate. It will be appreciated that other suitable arrangements of an interference exposure unit, can also be used. In particular, it will be appreciated that an interference exposure unit can include separate radiation sources to provide the beams of radiation that interfere.

Figure 6A:
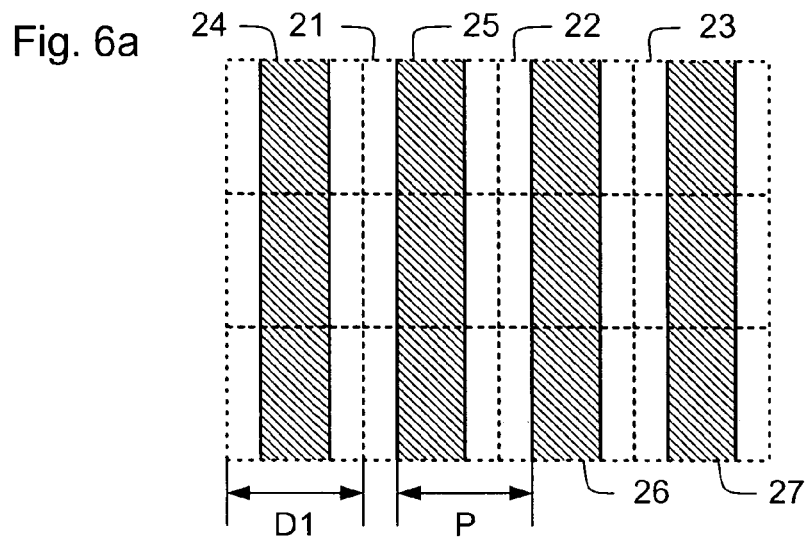
FIG. 6a depicts a portion of an exposure formed by a first exposure unit and its relationship to an exposure formed by a second exposure unit in a lithographic system, according to one embodiment of the present invention.

FIG. 6*a* schematically depicts a part of such an exposure of a plurality of lines. As shown a plurality of maxima 21,22,23 are separated by a plurality of minima 24,25,26,27. As shown in FIG. 6*a*, the pitch P of the lines, e.g., the width, perpendicular to the length of the lines, of a repeating unit consisting of a maxima and a minima, can be consistent across the exposure.

Also shown in FIG. 6*a* is a grid of possible exposure areas 30, corresponding to exposures each controlled by an individual individually controllable element in an exposure by the second exposure unit as discussed above. As shown, the width D1 of each exposure area 30 corresponding to the exposure controlled by an individually controllable element is the same as the pitch P of the lines exposed by the first exposure unit 10.

As discussed above, the second exposure unit can modulate a beam of radiation using an array of individually controllable elements and, accordingly, each exposure area 30 corresponding to an individually controllable element can be provided with an individually controllable exposure.

Figure 6B:
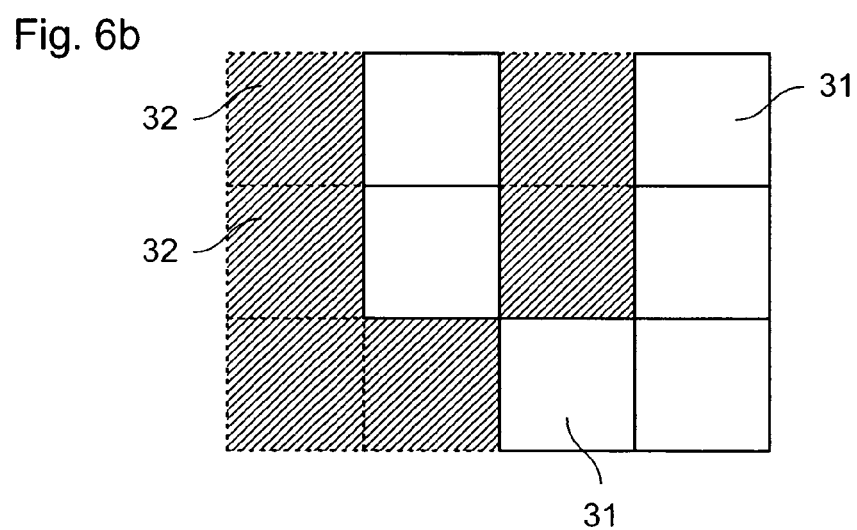
FIG. 6b depicts an exposure formed by a second exposure unit in a lithographic system, according to one embodiment of the present invention.

FIG. 6*b* depicts an example of an exposure that can be formed by the second exposure unit. As shown, some individually controllable elements, corresponding to a first group of exposure areas 31 have been set, such that those exposure areas receive a relatively high dose of radiation. Other individually controllable elements are set such that the corresponding exposure area 32 receive a relatively low dose of radiation.

Figure 6C:
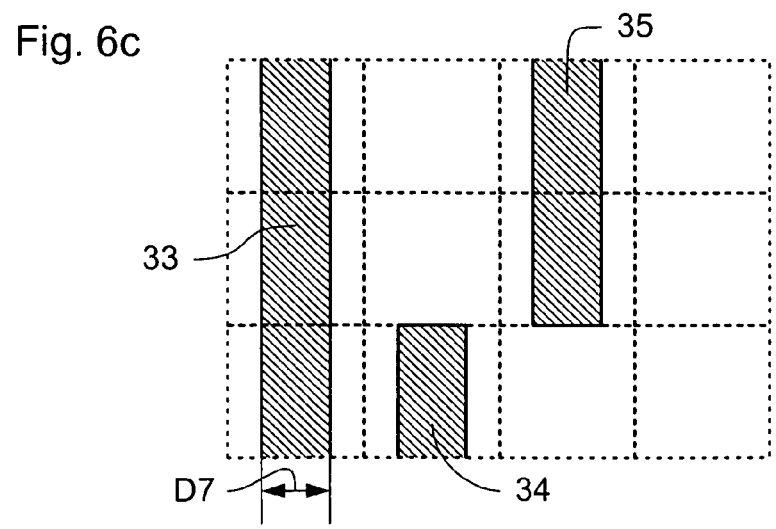
FIG. 6c depicts the corresponding exposure formed by the combination of the exposures depicted in FIGS. 6a and 6b.

FIG. 6*c* depicts the pattern that can be formed from the combination of the exposure shown in FIG. 6*a* by the first exposure unit and the exposure shown in FIG. 6*b* by the second exposure unit. As shown, the exposure by the second exposure unit has trimmed part or all of some of the lines exposed by the first exposure unit. As shown, pattern features 33,34,35 remain in the areas corresponding to both the minima lines 24,25,26,27 of the exposure by the first exposure unit and the exposure areas 32 corresponding to the individually controllable elements set to provide a relatively low dose in the exposure formed by the second exposure unit.

In one example, the pattern formed on the substrate is defined by the pattern set by the array of individually controllable elements in the second exposure unit, but the critical dimension CD of the pattern is defined by the first exposure unit, e.g., largely corresponds to the width of D2 of the lines of minima formed by the first exposure unit.

Such a system can provide a convenient compromise. The system is flexible because the pattern formed is defined by the array of individually controllable elements in the second exposure unit. The system can, however, be cheaper than one in which the pattern is solely formed by a lithographic apparatus, in which a beam of radiation is modulated by an array of individually controllable elements. In such a system, in order to provide sufficient control of the critical dimension CD of the pattern features, it is necessary to use smaller exposure areas corresponding to each of the individually controllable elements (for example, a minimum of two exposure areas per critical dimension CD unit is typical). Alternatively or additionally, it is necessary to provide grayscale control for each of the individually controllable elements, e.g., to be able to set the intensity of the radiation in each of the exposure areas corresponding to an individually controllable element to one of three or more different levels. In contrast, in the system as described above, the critical dimension CD is determined by the first exposure unit, and therefore simple binary control of the individually controllable elements, e.g., setting the elements to provide a relatively greater or relatively lower exposure dose in each of the corresponding exposure areas, is sufficient. Similarly, larger exposure areas can be used.

For example, as shown in FIGS. 6*a*, 6*b* and 6*c*, the critical dimension CD of the pattern formed on the substrate can be approximately half of the size of an exposure area 30 corresponding to an individually controllable element used in the second exposure unit. This, in turn, means that fewer individually controllable elements are required in order to provide the modulation for an exposure of a given size. Reducing the number of individually controllable elements and the number of levels to which element can be set significantly reduces the amount of data that must be provided to the array of individually controllable elements in the second exposure unit. This in turn can both reduce the complexity and cost of the data processing units that control the array of individually controllable elements and increase the speed at which the array of individually controllable elements can be updated, resulting in shorter times being required to expose the substrate, further reducing the cost of exposing the substrate.

Figure 7A:
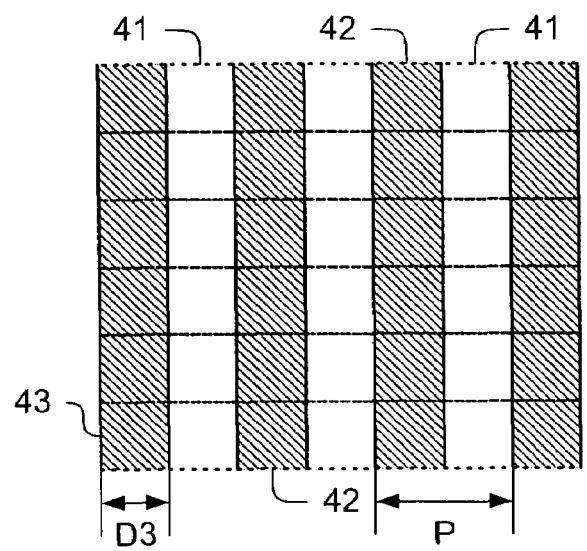
FIG. 7a depicts a portion of an exposure formed by a first exposure unit and its relationship to an exposure formed by a second exposure unit in a lithographic system, according to one embodiment of the present invention.
Figure 7B:
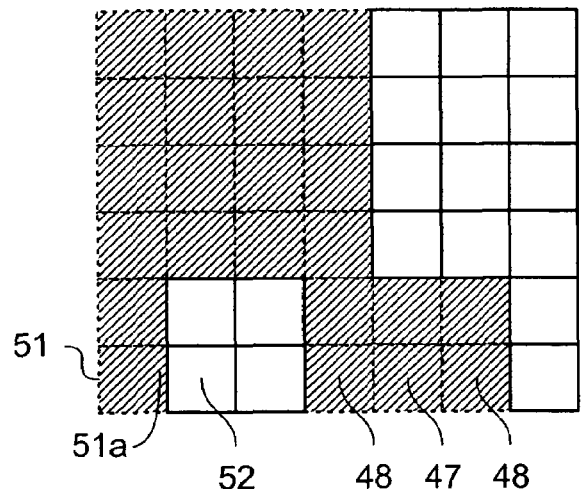
FIG. 7b depicts an exposure formed by a second exposure unit in a lithographic system, according to one embodiment of the present invention.
Figure 7C:
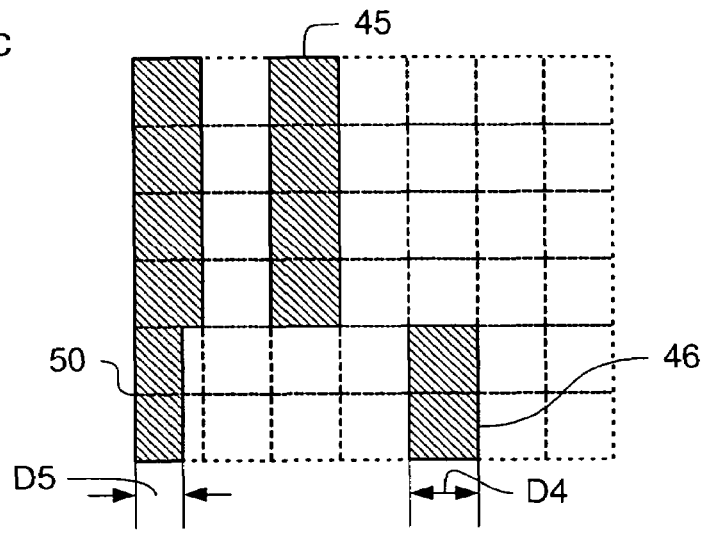
FIG. 7c depicts the corresponding exposure formed by the combination of the exposures depicted in FIGS. 7a and 7b.

FIGS. 7*a*, 7*b* and 7*c* show similar features as FIGS. 6*a*, 6*b* and 6*c*, but depict the exposure pattern of the first exposure unit, the exposure pattern of the second exposure unit and the resulting exposure of the substrate, respectively, for a lithographic system operating in a different mode from that shown in FIGS. 6*a*, 6*b* and 6*c*. As shown, the first exposure unit exposes a plurality of lines, consisting of a plurality of maxima 41 inter dispersed by minima 42. The pitch P of the lines can, again, be even across the exposure. However, in this case, the width D3 of an exposure area 43 corresponding to an individually controllable element in the second exposure unit is half the pitch P of the lines exposed by the first exposure unit. It can, therefore be the same as the width of a line of minima 42.

In one example, such an arrangement can be used to provide greater control of the pattern features than is available in a system operating in the mode depicted in FIGS. 6a, 6b and 6c. For example, a first group of pattern features 45,46 can be formed that have a width D4 that is the same as the width of the minima 43 of the lines exposed by the first exposure unit. This can be achieved, for example, by setting the individually controllable elements in the second exposure unit such that exposure areas 47 that are arranged to be aligned with the minima 43 of the lines exposed by the first exposure unit are set to have a relatively low exposure dose, as are the exposure areas 48 on either side of the minima line 43.

In one example, the width D5 of a second group of pattern features 50 can be adjusted, for example, such that the width D5 of the pattern features 50 is smaller than the width D4 of the first group of pattern features 45,46. This can be achieved, for example, by setting the exposure areas 51 that are aligned with the minima lines 43 to provide a relatively low exposure dose, but setting the individually controllable elements corresponding to adjacent exposure area 52 to provide a relatively high exposure dose. In this case, due to diffractive effects, some radiation associated with the exposure area 52 adjacent the minima line will actually be incident on the edge 51a of the adjacent exposure area 51 that is aligned with a minima line from the exposure by the first exposure unit. As a result, as shown in FIG. 7c, the width D5 of the pattern feature 50 is reduced.

Figure 8A:
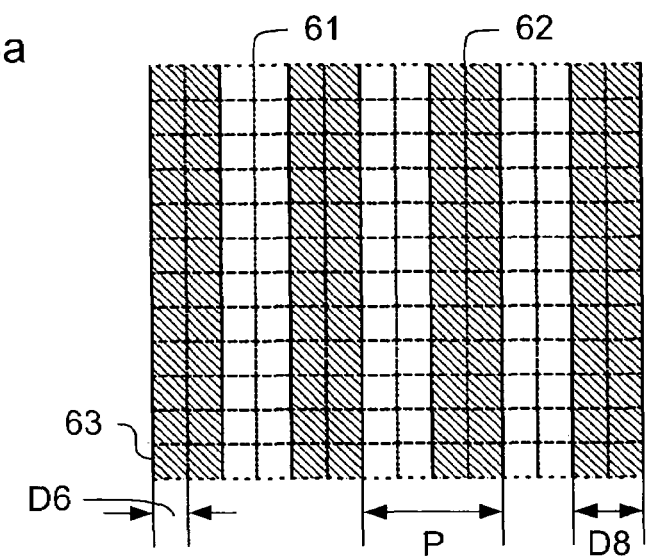
FIG. 8a depicts a portion of an exposure formed by a first exposure unit and its relationship to an exposure formed by a second exposure unit in a lithographic system, according to one embodiment of the present invention.
Figure 8B:
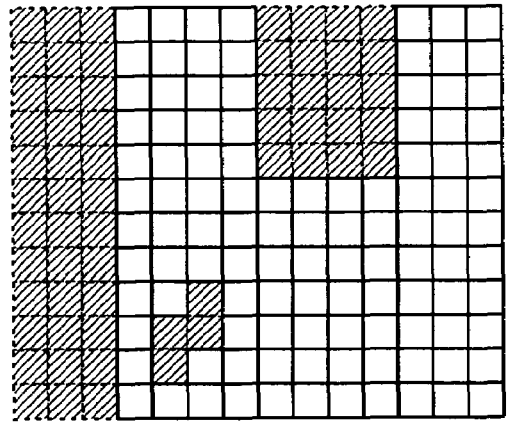
FIG. 8b depicts an exposure formed by a second exposure unit in a lithographic system, according to one embodiment of the present invention.
Figure 8C:
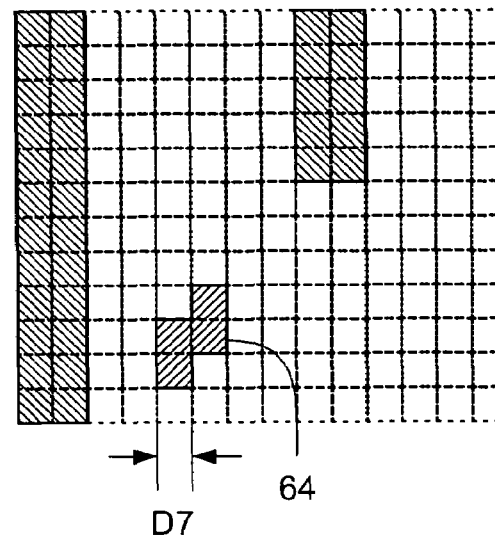
FIG. 8c depicts the corresponding exposure formed by the combination of the exposures depicted in FIGS. 8a and 8b.

FIGS. 8a, 8b and 8c depict a further variation of a lithographic system, according to another embodiment of the present invention. In this case, the pitch P of the lines of maxima and minima 61,62 exposed by the first exposure unit is four times the width D6 of an exposure area 63 corresponding to an individually controllable element in the second exposure unit. Such an arrangement permits the formation of pattern features 64 having a width D7 that is smaller than the width D8 of the lines of minima 62 formed by the first exposure unit. In addition, although not depicted in FIGS. 8a, 8b and 8c, it will be appreciated that the use of smaller exposure areas 63 corresponding to each individually controllable element in the second exposure unit, compared to the operation mode depicted in FIGS. 7a, 7b and 7c, provides greater accuracy in the control of the edge of a pattern feature.

However, as the size of the exposure areas corresponding to each individually controllable element in the second exposure unit decreases, the number of individually controllable element required increases, increasing the cost and complexity of the apparatus.

In general, it should be appreciated that the size of the exposure areas corresponding to an individually controllable element in the second exposure unit can be set to any size. Thus, the pitch P of the lines exposed by the first exposure unit is an integer multiple of the width, in a direction perpendicular to the length of the lines exposed by the first exposure unit, of an exposure area corresponding to an individually controllable element of the second exposure unit.

It will be appreciated that the above description has described the lithographic system in relation to a system in which the second exposure unit has an array of individually controllable elements in which each of the individually controllable elements can be set to provide relatively more or relatively less radiation to the associated exposure area on the substrate, , e.g., only has two states. Such an array of individually controllable elements is often referred to as a binary array. It will be appreciated, however, that a grayscale array of individually controllable elements, e.g., one in which each of the individually controllable elements can be set to any one of three or more states, corresponding to different radiation intensity levels being provided to the corresponding exposure area on the substrate, can be used. The use of such a grayscale array of individually controllable elements can, for example, be used in order to provide additional control of the position of edges of the pattern features.

Arrays of individually controllable elements that permits the control of the phase of the radiation in one exposure area compared to an adjacent exposure area can also be used. Such an array of individually controllable elements made be one in which the individually controllable elements are piston-actuating mirrors or phase-step tilt mirrors. Each individually controllable element can also be comprised of a plurality of sub-elements. For example, an individually controllable element can comprise a 2×2 array of piston-actuating mirrors, providing control of both phase and intensity of the radiation. A desired result of providing a second exposure unit in which the relative phase of the radiation projected on the substrate, associated with adjacent individually controllable elements can be controlled, is that in place of setting one of the individually controllable elements to provide zero intensity radiation, one can, for example, set the individually controllable element such that the amplitude of the radiation is negative. In other words, once can create a phase difference between the radiation associated with adjacent individually controllable elements. The consequence of this is that the slope of the radiation intensity profile across the substrate is increased at the boundary between the two individually controllable elements. Provision of control of the slope of the intensity distribution permits the control of the position at which the intensity distribution crosses the threshold of the resist, e.g., the edge of the feature of a pattern being exposed. Accordingly, provision of individually controllable elements having phase control, as well as intensity control, permits additional accuracy in the control of the pattern formed by the second exposure unit.

It will be understood from the above description that the size of the exposure areas corresponding to the individually controllable elements of the second exposure unit relative to the pitch of the line exposed by the first exposure unit can be set. This can be done so that the edges of the lines exposed by the first exposure unit can be aligned with the edges of the exposure areas corresponding to the individually controllable parts of the second exposure unit across the exposure. The lithographic system can be provided with an exposure size controller that is arranged to control at least one of the pitch of the lines exposed by the first exposure unit and the size of the exposure areas of the second exposure unit corresponding to an individually controllable element.

Such an exposure size controller can be used initially to set up the lithographic system in order to ensure that the pitch of the lines exposed by the first exposure unit are the correct size relative to the size of the exposure areas corresponding to the individually controllable elements of the second exposure unit in order to ensure that the lines exposed by the first exposure unit are accurately aligned with the exposures corresponding to each of the individually controllable elements of the second exposure unit across the respective exposure fields.

The exposure size controller can, alternatively or additionally, be configured to make any necessary adjustments between the exposure of batches of substrates, between the exposure of individual substrates, between the exposure of different areas of a given substrate and/or during the exposure of a given area on a substrate in order to ensure that accurate alignment between the exposures by the first and second exposure units is maintained.

The exposure size controller can be configured such that it can ensure the required accuracy of a given relationship between the pitch of the lines exposed by the first exposure unit and the width of an exposure area corresponding to an individually controllable element (for example, the pitch being one, two or four times the width of the exposure area). Alternatively or additionally, the exposure size controller can be constructed such that it can switch the lithographic system between two or more modes of operation, each mode being associated with a different relationship between the pitch of the lines exposed by the first exposure unit and the width of the exposure areas corresponding to the an individually controllable element of the second exposure unit (for example, in a first mode of operation the pitch of the lines equals the width of the exposure area; in a second operation mode, the pitch of the lines is twice the width of the exposure area; and, in a third operation mode, the pitch of the lines is four times the width of the exposure areas).

Exemplary Embodiment 1

Figure 9:
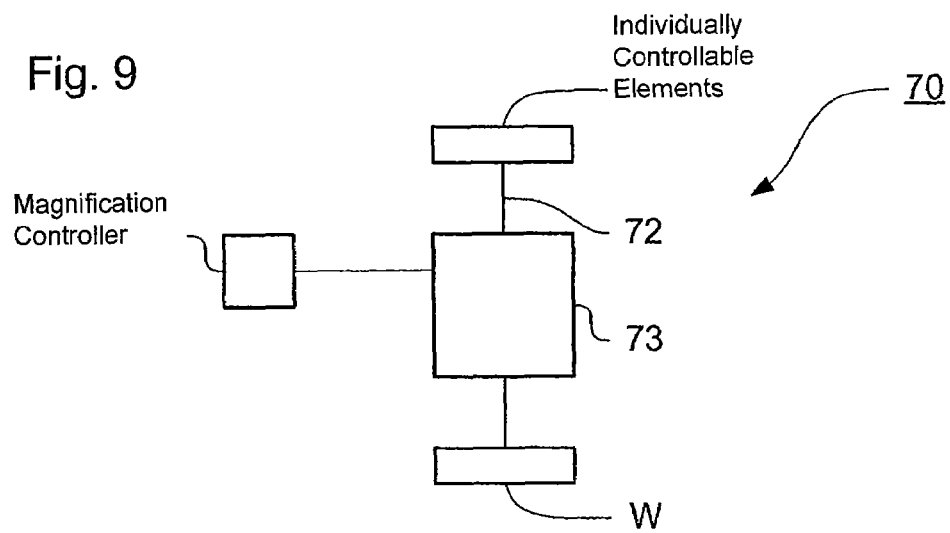
FIG. 9 depicts an exposure unit that can be used in a lithography system, according to one embodiment of the present invention.

FIG. 9 depicts schematically an arrangement of a second exposure unit 70, according to one embodiment of the present invention. The second exposure unit 70 comprises an array of individually controllable elements that modulates a beam of radiation to form a modulated beam of radiation 72 and a projection system 73 that projects the modulated beam of radiation 72 onto a substrate W. In this embodiment, the exposure size controller can be a magnification controller 74 that is configured to control the magnification of the modulated beam of radiation 72 imparted by the projection system 73 as it projects the modulated beam of radiation 72 onto the substrate W. The magnification controller can perform magnification control by, for example, at least one of adjusting the separation of two or more optical components within the projection system, adding additional optical components into the radiation beam path within the projection system 73, removing optical components from the radiation beam path within the projection system and replacing one or more optical components with alternative optical components within the projection system. It will be appreciated that adjusting the magnification of the projection system 73 adjusts the size of an exposure area corresponding to an individually controllable element in the array of individually controllable elements, thus adjusting the size of the exposure area relative to the pitch of the lines exposed by the first exposure unit.

Exemplary Embodiment 2

The exposure size controller can alternatively or additionally adjust the pitch of the lines exposed by the first exposure unit. Accordingly, the first exposure unit 10 can include reflector actuators 81,82 associated with the radiation beam reflectors 16,17, for example as depicted in FIG. 5. The reflector actuators 81,82 can be constructed to adjust the position of the reflectors 16,17 such that the angle at which the beams of radiation 14,15 are projected onto the substrate W can be adjusted. The actuators can, for example, be piezoelectric actuators, Lohrentz actuators, or the like. The adjustment of the angle at which the beams of radiation 14,15 are projected onto the substrate in turn adjusts the pitch of the lines that are exposed on the substrate by the first exposure unit 10.

It will be appreciated that the reflector actuators 81,82 can, as well as adjusting the angle of the reflectors 16,17, adjust the separation between the reflectors and the substrate W. This can be done in order to compensate for the change in the angle at which the beams of radiation 14,15 are projected onto the substrate. Alternatively or additionally, an actuator can be provided in order to adjust the position of the substrate W in order to provide this compensation. In a system as discussed above, the exposure size controller can comprise a beam angle controller 80 that is constructed to control the reflector actuators 81,82.

Embodiment 3

Figure 10:
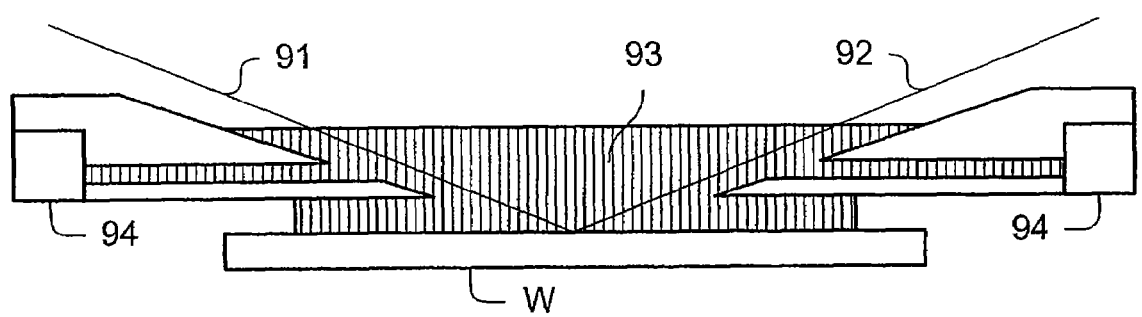
FIG. 10 depicts a detail of a possible configuration of an exposure unit according to the lithographic system, according to one embodiment of the present invention.

FIG. 10 schematically depicts an arrangement by which the pitch of the lines exposed by the first exposure unit can alternatively or additionally be adjusted, according to another embodiment of the present invention. As shown, in this embodiment an immersion showerhead 90 is provided to the first exposure unit such that the beams of radiation 91,92 are projected through an immersion liquid 93 that is provided adjacent the substrate W. As a result of the immersion liquid 93 having a higher refractive index than air, such an arrangement can be used in order to expose lines with a smaller pitch than are available for exposures in air, in turn resulting in pattern features having a smaller critical dimension CD. The value of the refractive index of the immersion liquid 93, and hence the value of the pitch of the lines exposed by the first exposure unit, can be adjusted by altering the composition of the immersion liquid 93. Accordingly, the exposure size controller can comprise a liquid composition controller 94 constructed such that it can control the refractive index of the immersion liquid 93 by controlling its composition.

It should appreciated that the exposure size controller can comprise any combination of the systems described above for adjusting the pitch of the lines exposed by the first exposure unit and/or the size of the exposures on the substrate by the second exposure unit corresponding to a single individually controllable element. Other systems for adjusting the pitch of the lines relevant to the size of the exposure on the substrate corresponding to a single individually controllable element are also considered to be within the scope of this aspect of the invention.

Embodiment 4

As depicted in the embodiment of the present invention shown in FIG. 5, the first exposure unit 10 can include a radiation intensity controller 100, constructed to control the intensity of the beams of radiation 14,15. In the arrangement shown in FIG. 5, with a single source of radiation 11, the radiation intensity controller 100 simply controls the intensity of the beam of radiation 12 provided by the radiation source 11. In the case of an arrangement in which each of the beams of radiation 14,15 are provided by separate radiation sources (not shown) the radiation intensity controller adjusts both sources in order to provide the required intensity control and in order to match the intensity of the two beams of radiation.

Figure 11:
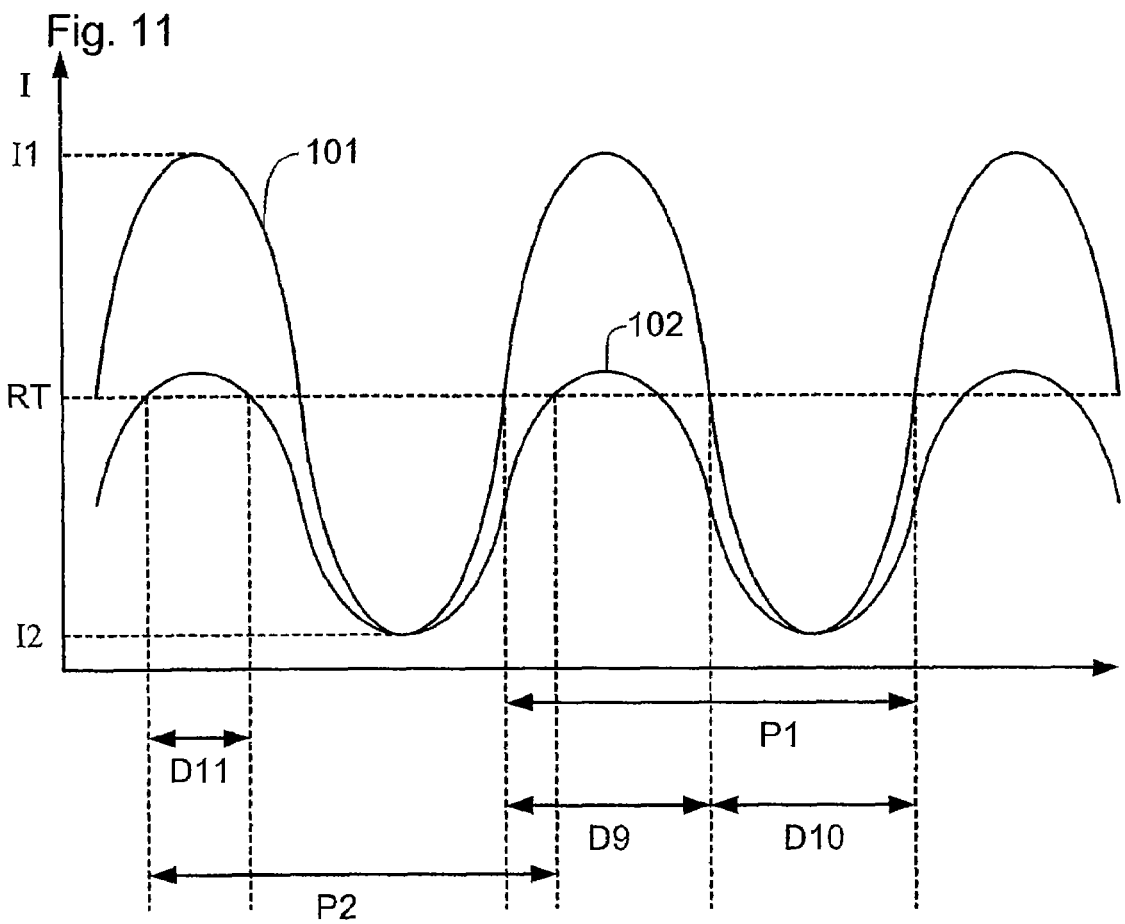
FIG. 11 depicts the radiation intensity profile that can be generated by an exposure unit in a lithographic system, according to one embodiment of the present invention.

The radiation intensity controller can be used in order to adjust the size of the maxima relative to the minima of the lines exposed by the first exposure unit. FIG. 11 shows how this can be achieved, according to one embodiment of the present invention. FIG. 11 depicts the intensity 1 of the radiation received at the substrate across a plurality of lines exposed by the first exposure unit. As shown, the interference of the two beams of radiation results in a periodic pattern of radiation intensity. For example, the pattern can follow a sin squared distribution. A first line 101, represents the pattern formed using beams of radiation at a first intensity level. The horizontal broken line in FIG. 11 represents the threshold RT of the resist on the substrate. For a given exposure time, regions on the substrate receiving a radiation intensity above the threshold RT correspond to regions where the resist will change state and regions on the substrate below the resist threshold RT correspond to regions in which the resist will not change state. As shown, the lines of maxima correspond to the regions in which the intensity exceeds the resist threshold RT and the lines of minima correspond to the regions in which the radiation intensity is below the resist threshold RT.

The pitch P1 of the lines exposed by the first exposure unit using radiation at the first intensity level corresponds to the period of the sinusoid 101. The intensity of the radiation beams in this case is set such that the radiation threshold RT is half way between the maximum radiation intensity 11 of the sinusoid 101 and the minimum radiation intensity 12. Consequently, the width D9 of the lines of maxima equals the width D10 of the lines of minima, e.g., half the pitch P1.

FIG. 11 also shows a second sinusoid 102, representing the radiation intensity profile at the substrate if the intensity of the beams of radiation is reduced to a second level. As shown, the pitch P2 of the lines exposed on the substrate is the same as with the radiation at the first intensity level because the period of the sinusoid is the same. However, the width D11 of the lines of maxima, e.g., the portion of the substrate receiving radiation above the resist threshold RT, is smaller than the width D9 of the maxima when the first exposure unit is operating at the first radiation intensity.

Accordingly, the radiation intensity controller can be used to control the size of the lines of maxima relative to the size of the lines of minima exposed by the first exposure unit but does not affect the pitch of the lines.

The radiation intensity controller can be set to provide radiation at the first intensity level, discussed above. This is because at this level small variations in the intensity of the beams of radiation have the least affect on the width of the lines of maxima and minima, e.g., will have the least effect on the critical dimension CD of the pattern features generated on the substrate.

It will be appreciated that this embodiment can be used in combination with any of the embodiments discussed above or any combination thereof.

It should be appreciated that in relation to all of the above embodiments, the first exposure unit and the second exposure unit can be separate apparatus.

Figure 12:
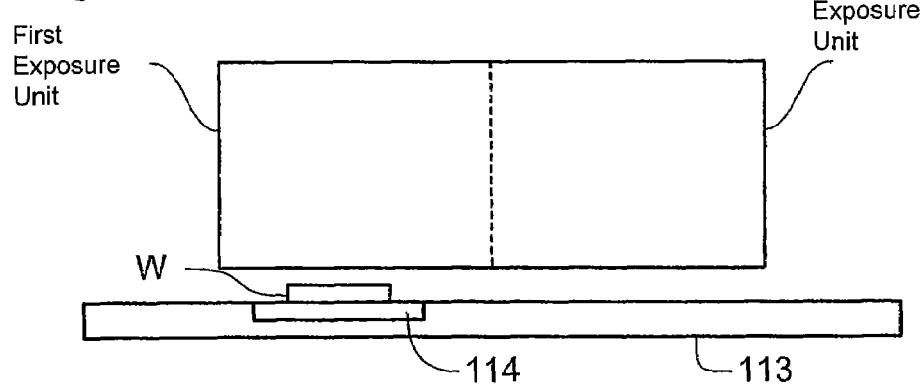
FIG. 12 depicts a lithographic system, according to one embodiment of the present invention.

Alternatively, as shown in one embodiment in FIG. 12, the first and second exposure units can be combined to form a single lithographic apparatus. As shown, such a lithographic apparatus can include a support 113, that is constructed to support the substrate W. The first and second exposure units can constructed such that the substrate can be exposed by either the first or second exposure unit without moving the substrate. Alternatively, the support 113 can be constructed such that it can move the substrate W from a position in which it can be exposed by the first exposure unit to a second position in which it can be exposed by the second exposure unit.

As explained above, the first exposure unit exposes a pattern of elongate lines parallel to a given direction and the second exposure unit trims the lines exposed by the first exposure unit in order to provide a required pattern. Accordingly, a first exposure unit, as discussed above, can be used in order to form pattern features consisting of elongate elements that are parallel to a single given direction. In order to form devices on a substrate, it can be necessary to form pattern features that are elongate parallel to one or more other directions, for example, perpendicular to the given direction.

Therefore The lithographic system of one embodiment of the present invention can be provided with a substrate turning mechanism constructed to turn a substrate about an axis perpendicular to the plane of the substrate. This can be done so that the first exposure unit can expose a second plurality of lines, arranged at a different orientation from the first plurality of lines, exposed on the substrate by the first exposure unit. These lines can then be trimmed by an exposure by the second exposure unit. Such a turning apparatus can be provided in the first exposure unit, the second exposure unit, a substrate handling device used to transfer the substrate between the first exposure unit and the second exposure unit in the case of the units being separate apparatus and/or the turning apparatus 114 can be part of the support 113 for the substrate in the case that the first and second exposure units are formed in an integral apparatus.

Embodiment 5

As discussed above, the first and second exposure units can be formed as separate units. Therefore, according to another embodiment of the present invention, there is provided an interference exposure unit 120 configured to project two beams of radiation onto a substrate such that the beams of radiation interfere to expose a plurality of lines on the substrate. Unit 120 can be used in conjunction with a lithographic unit that is configured to modulate a beam of radiation and project the modulated beam of radiation onto the substrate. For example, this can be done to trim the lines exposed on the substrate by the interference exposure unit. A radiation-sensitive layer processing unit can be used to perform at least one of: applying a layer of radiation-sensitive material to a substrate before an exposure, heating the unexposed substrate, applying an anti-reflective coating to the substrate (this can be one or both of a top anti-reflective coating and a bottom anti-reflective coating), applying a water impermeable coating to the substrate, applying a coating to the substrate to make the surface hydrophobic or hydrophilic, heating the substrate after exposure, controlled cooling of the substrate after heating, removal of one or more of an anti-reflective coating, a water impermeable coating and a hydrophobic or hydrophilic coating, and/or removal of one of exposed and unexposed resist from the substrate.

In one example, the interference exposure unit is configured to be used in conjunction with existing lithography units and existing radiation sensitive layer processing units.

In a similar manner to that discussed above, the critical dimension of the pattern formed on the substrate by the combination of the exposures from the interference exposure unit and a lithography unit can be determined by the pitch of the lines exposed by the interference exposure unit. Therefore, the addition of the interference exposure unit to an existing lithography unit can permit the lithography unit to be used for forming patterns with smaller critical dimensions and/or with better critical dimension control that was possible with the lithography unit on its own.

It should be appreciated that for this embodiment of this invention, the lithography unit need not use an array of individually controllable elements to modulate the beam of radiation but can, for example, modulate the beam of radiation with a mask. Likewise, the pitch of the lines exposed by the interference unit need not be matched to the size of exposures by the lithography unit as in the first aspect of the invention. However, one or both of these features can be combined with the second aspect of the invention.

Figure 13:
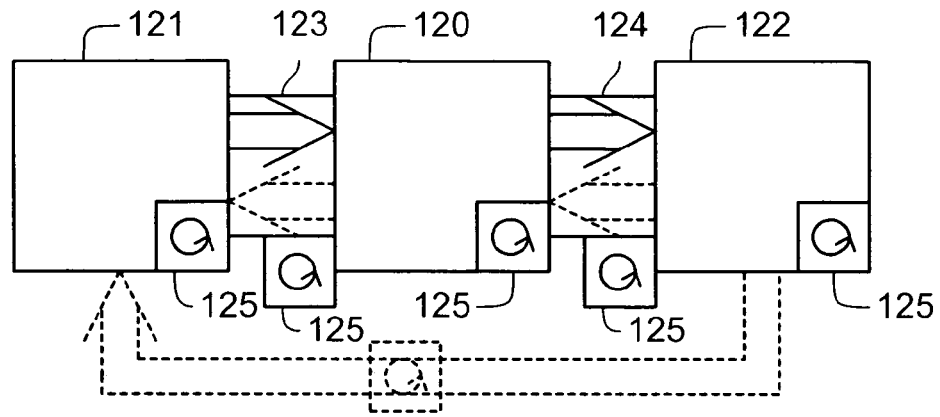
FIG. 13 depicts an alternative lithographic system, according to one embodiment of the present invention.

FIG. 13 depicts a further embodiment of the present invention comprising a lithographic system combining a radiation-sensitive layer processing unit 121 and a lithography unit 122 with an interference exposure unit 120, similar to as discussed above. Substrate handling units 123,124 are provided between the radiation-sensitive layer processing unit 121 and the interference exposure unit 120 and between the interference exposure unit 120 and the lithography unit 122, respectively. The substrate handling units 123,124 can be part of the radiation sensitive layer processing unit, part of the interference exposure unit, part of the lithography unit, or separate apparatus.

As shown, the lithography system is configured such that a substrate can be passed from the radiation sensitive layer processing unit 121 to the lithography unit 122 via the interference exposure unit 120. Likewise, the substrate can be transferred from the lithography unit 122 back to the radiation sensitive layer processing unit 121 via the interference exposure unit. Alternatively or additionally, an additional substrate handler can be provided to transfer substrates directly from the lithography unit 122 to the radiation sensitive layer processing unit 121.

As discussed above, between successive exposures of lines on a substrate by an interference exposure unit, it can be desirable to rotate a substrate about an axis perpendicular to its player surface. Accordingly, at least one of the radiation sensitive layer processing unit, the interference exposure unit, the lithography unit and the substrate handlers can include a unit 125 for rotating the substrate as desired.

Figure 14:
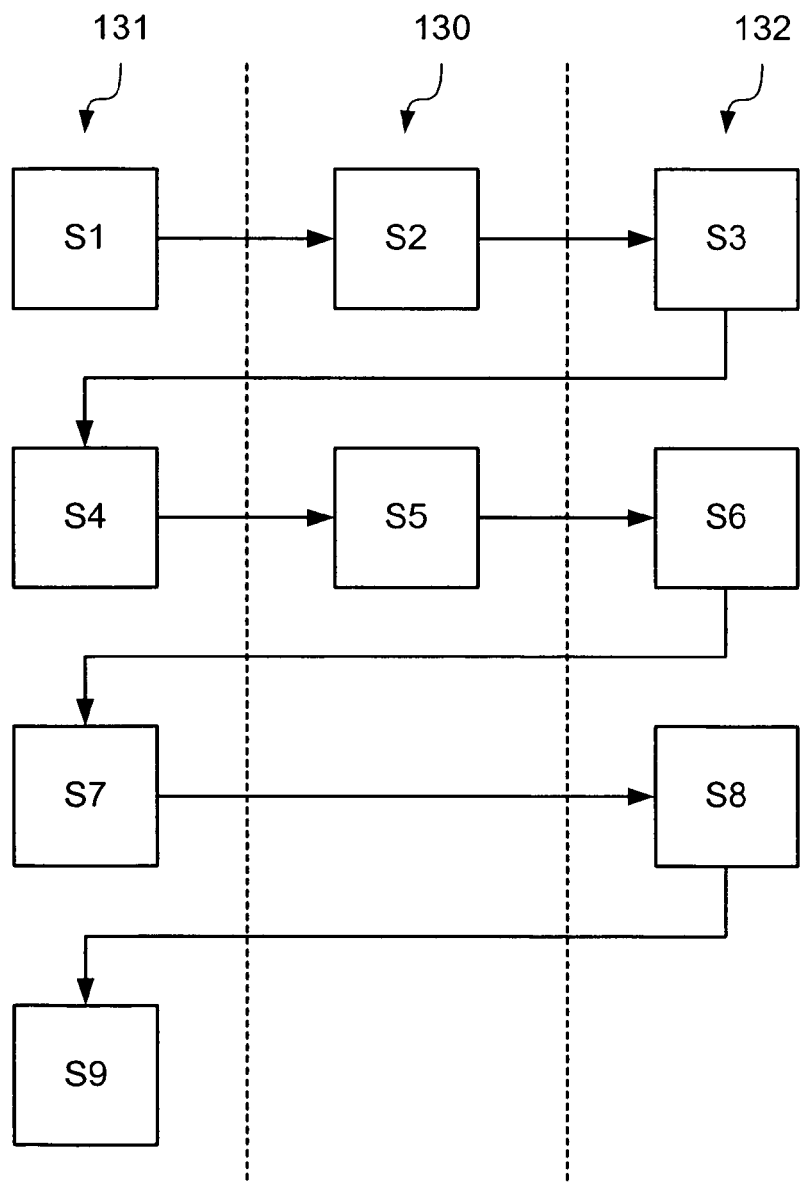
FIG. 14 depicts a flow diagram representing possible process steps performed in a lithographic system, according to one embodiment of the present invention.

FIG. 14 depicts the process steps that can be performed by a lithography system, such as that shown in FIG. 13, in order to expose a desired pattern on a substrate, according to one embodiment of the present invention. As shown, the process steps depicted in the first column 131, are performed by the radiation sensitive layer processing unit 121, the process steps depicted in the second column 130 are performed by the interference exposure unit 120 and the process steps depicted in the third column 132 are performed by the lithography unit 122.

In step S1, the radiation sensitive layer processing unit applies a layer of radiation-sensitive material, e.g., a resist or a photoresist, to the substrate. This can include a spin coating process followed by a soft bake (heating) and controlled cooling, for example. In step S2, a plurality of lines parallel to a first direction are exposed on the substrate by the interference exposure unit. In step S3, the lines exposed in S2 are trimmed using the lithography unit. In step S4, the resist is hard-baked (heated to a relatively high temperature) and cooled in a controlled manner in order to develop the resist and, subsequently, a fresh layer of resist is applied to the substrate. In step S5, a second plurality of lines are exposed on the substrate using the interference exposure unit, oriented differently from those exposed in step S2, for example, perpendicularly. In step S6, the lithography unit is used to trim the lines exposed in step S4. In step S7, the second layer of resist is hard-baked and developed.

Depending on the pattern to be formed, the steps to this stage can be sufficient to form the entire pattern. Indeed, if the pattern to be formed consists solely of elongate pattern features parallel to a single direction, steps S4 to S6 can be omitted.

Optionally, however, step S7 can include the coating of an additional layer of resist on the substrate. Subsequently, in step S8, the lithography unit can be used to form large features, e.g., those having minimum dimensions larger than the width of the lines formed in the interference exposure unit. Finally, in step S9, a final baking and development step is performed.

It should be appreciated that, in the same way as discussed above, the interference exposure unit can be constructed to expose first and second pluralities of lines on the substrate, oriented in different directions. Alternatively or additionally, the substrate can be rotated by a rotating unit 125 between steps S2 and S4. It would further be appreciated that the radiation sensitive layer processing unit 121 can perform additional steps other than those discussed above in relation to steps S1, S4, S7 and S9.

The embodiments of the invention described above have been described in relation to a dual exposure process using a single resist layer. In other words, a single layer of radiation sensitive material (e.g., a resist or a photoresist) is applied to a substrate. Thereafter, this layer of radiation-sensitive material is exposed by both a first exposure unit and a second exposure unit before the layer of radiation-sensitive material is developed. It should be appreciated, however, that with the appropriate modifications, the invention can be applied to a dual resist layer process. In such a process, a first layer of radiation-sensitive material is applied to a substrate. The first layer is exposed using a first exposure unit and the first layer of radiation-sensitive material is subsequently developed. A second layer of radiation-sensitive material is then applied to the substrate and exposed by the second exposure unit. The second layer of radiation-sensitive material is then developed.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g. semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic system for exposing a pattern on a substrate, comprising:
   an interference exposure unit that projects two beams of radiation onto at least a portion of the substrate, such that the two beams of radiation interfere to expose a plurality of lines; and
   a lithography unit that modulates a beam of radiation using an array of individually controllable elements and projects the modulated beam onto at least a portion of the substrate;
   wherein the interference exposure unit and the lithography unit are configured such that a pitch of the lines exposed by the interference exposure unit, in a direction perpendicular to a length of the lines, is an integer multiple of a width, in a direction of the exposure on the substrate by the lithography unit, corresponding to a single individually controllable element.

2. The lithographic system of claim 1, wherein the pitch of the lines exposed by the interference exposure unit is one, two or four times the width of the exposure corresponding to a single individually controllable element of the lithography unit.

3. The lithographic system of claim 1, further comprising:
   an exposure size controller that is constructed to control at least one of the pitch of the lines exposed by the interference exposure unit and the size of the exposure corresponding to a single individually controllable element of the lithography unit.

4. The lithographic system of claim 1, wherein the lithography unit comprises:
   a projection system that projects the modulated beam of radiation onto the substrate,
   wherein the projection system has variable magnification, such that the size of the exposure on the substrate corresponding to one of the individually controllable elements is adjustable.

5. The lithographic system of claim 4, further comprising:
   a magnification controller that controls magnification of the projection system in order to maintain a given relationship between the pitch of the lines and the width of the exposure corresponding to one of the individually controllable elements.

6. The lithographic system of claim 4, wherein the magnification of the projection system is adjustable so as to switch the lithographic system between operation in which the integer multiple relating the pitch of the lines to the width of the exposure corresponding to one individually controllable element has a first value and operation in which the integer multiple has a second value.

7. The lithographic system of claim 1, wherein:
   the interference exposure unit is configured such that the two beams of radiation are each projected onto the substrate at respective oblique angles; and
   the interference exposure unit comprises a beam angle controller that adjusts the angles at which the two beams are projected onto the substrate.

8. The lithographic system of claim 1, wherein:
   the interference exposure unit is configured such that the two beams of radiation are each projected onto the substrate through a liquid that is adjacent the substrate; and
   the interference exposure unit comprises a liquid composition controller constructed to control the refractive index of the liquid by controlling its composition.

9. The lithographic system of claim 1, wherein the interference exposure unit comprises a radiation intensity controller that controls the intensity of the two beams of radiation.

10. The lithographic system of claim 1, wherein the array of individually controllable elements is constructed such that each individually controllable element controls a phase of the radiation in the corresponding portion of the modulated beam of radiation projected onto the substrate by the lithography unit relative to adjacent portions of the modulated beam of radiation.

11. The lithographic system of claim 1, wherein the array of individually controllable elements is constructed such that each individually controllable element is set to one of two possible states in which relatively more and relatively less radiation, respectively, is projected onto the substrate in the corresponding portion of the modulated beam of radiation.

12. The lithographic system of claim 1, wherein the array of individually controllable elements is constructed such that each individually controllable element is set to one of three or more possible states, each associated with a different intensity of radiation being projected onto the substrate in the corresponding portion of the modulated beam of radiation.

13. The lithographic system of claim 1, further comprising:
   a radiation sensitive layer processing unit that processes a substrate,
   wherein the interference exposure unit is arranged such that the substrate is transferred from the radiation sensitive layer processing unit to the lithography unit through the interference exposure unit.

14. The lithographic system of claim 13, wherein at least one of the radiation sensitive layer processing unit, the lithography unit, and the interference exposure unit comprises:
   a substrate rotator that is constructed to rotate the substrate about an axis perpendicular to the planar surface of the substrate.

15. The lithographic system of claim 13, wherein the interference exposure unit comprises:
   a substrate handler that at least one of receives the substrate from or transfers the substrate to at least one of the radiation sensitive layer processing unit and the lithography unit.

16. The lithographic system of claim 13, wherein the lithography unit comprises:
   an array of individually controllable elements that is configured to perform the modulation of the beam of radiation.

17. The lithographic system of claim 13, wherein the a radiation sensitive layer processing unit performs at least one of: (a) heating the unexposed substrate, (b) applying an anti-reflective coating to the substrate, (c) applying a water impermeable coating to the substrate, (d) applying a coating to the substrate to make the surface hydrophobic or hydrophilic, or (e) removing one or more of an anti-reflective coating, a water impermeable coating, and a hydrophobic or hydrophilic coating.

18. A device manufacturing method, comprising:
   projecting two beams of radiation onto at least a portion of a substrate, such that the two beams of radiation interfere to expose a plurality of lines; and
   modulating a beam of radiation using an array of individually controllable elements; and
   projecting the modulated beam of radiation onto at least the portion of the substrate,
   wherein a pitch of the exposed plurality of lines, in a direction perpendicular to a length of the lines, is an integer multiple of a width, in the direction of an exposure on the substrate by the modulated beam, corresponding to a single individually controllable element.

19. The device manufacturing method of claim 18, comprising:
   processing a substrate in a radiation sensitive layer processing unit;
   projecting two beams of radiation onto at least a portion of the processed substrate, such that the two beams of radiation interfere to expose a plurality of lines; and
   projecting a modulated beam of radiation onto at least the portion of the exposed substrate.

20. The device manufacturing method of claim 19, wherein the processing step comprises at least one of: (a) heating the unexposed substrate, (b) applying an anti-reflective coating to the substrate, (c) applying a water impermeable coating to the substrate, (d) applying a coating to the substrate to make the surface hydrophobic or hydrophilic, or (e) removing one or more of an anti-reflective coating, a water impermeable coating, and a hydrophobic or hydrophilic coating.

* * * * *